(12) United States Patent
Chen et al.

(10) Patent No.: US 12,082,421 B2
(45) Date of Patent: *Sep. 3, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Tzu-Yu Chen, Hsinchu (TW); Sheng-Hung Shih, Hsinchu (TW); Fu-Chen Chang, Hsinchu (TW); Kuo-Chi Tu, Hsinchu (TW); Wen-Ting Chu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,245

(22) Filed: May 26, 2023

(65) Prior Publication Data

US 2023/0309318 A1    Sep. 28, 2023

Related U.S. Application Data

(63) Continuation of application No. 17/331,926, filed on May 27, 2021, now Pat. No. 11,706,930.

(51) Int. Cl.
| | |
|---|---|
| H01L 21/00 | (2006.01) |
| H01L 21/02 | (2006.01) |
| H01L 49/02 | (2006.01) |
| H10B 53/30 | (2023.01) |

(52) U.S. Cl.
CPC .......... *H10B 53/30* (2023.02); *H01L 21/0234* (2013.01); *H01L 21/02356* (2013.01); *H01L 28/60* (2013.01)

(58) Field of Classification Search
CPC ............... H10B 53/30; H01L 21/0234; H01L 21/02356; H01L 28/60
See application file for complete search history.

(56) References Cited

U.S. PATENT DOCUMENTS

| | | | |
|---|---|---|---|
| 10,164,182 B1 | 12/2018 | Trinh et al. | |
| 11,706,930 B2 * | 7/2023 | Chen | H01L 28/60 257/532 |
| 2010/0087014 A1 | 4/2010 | Nagai | |

OTHER PUBLICATIONS

Wan et al., "Annealing Mechanism and Effect of Microwave Plasma Assisted Annealing on Properties of Sputtered Thin Films", Journal of Nanoscience and Nanotechnology, vol. 16, pp. 2866-2871, 2016.

* cited by examiner

*Primary Examiner* — Richard A Booth

(74) *Attorney, Agent, or Firm* — Birch, Stewart, Kolasch & Birch, LLP

(57) ABSTRACT

A semiconductor device includes a bottom electrode, a top electrode, a sidewall spacer, and a data storage element. The sidewall spacer is disposed aside the top electrode. The data storage element is located between the bottom electrode and the top electrode, and includes a ferroelectric material. The data storage element has a peripheral region which is disposed beneath the sidewall spacer and which has at least 60% of ferroelectric phase. A method for manufacturing the semiconductor device and a method for transforming a non-ferroelectric phase of a ferroelectric material to a ferroelectric phase are also disclosed.

20 Claims, 18 Drawing Sheets

SEMICONDUCTOR DEVICE AND METHOD FOR MANUFACTURING THE SAME

REFERENCE TO RELATED APPLICATION

This application is a continuation of U.S. patent application Ser. No. 17/331,926, filed on May 27, 2021, the contents of which is incorporated herein by reference in its entirety.

BACKGROUND

A ferroelectric random-access memory (FeRAM) device is a non-volatile memory device using a ferroelectric material layer. The FeRAM device is one promising memory device due to its advantages, such as lower power usage, faster write performance, and greater data retention. Nevertheless, there is still a need to improve the electrical characteristics of the FeRAM device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
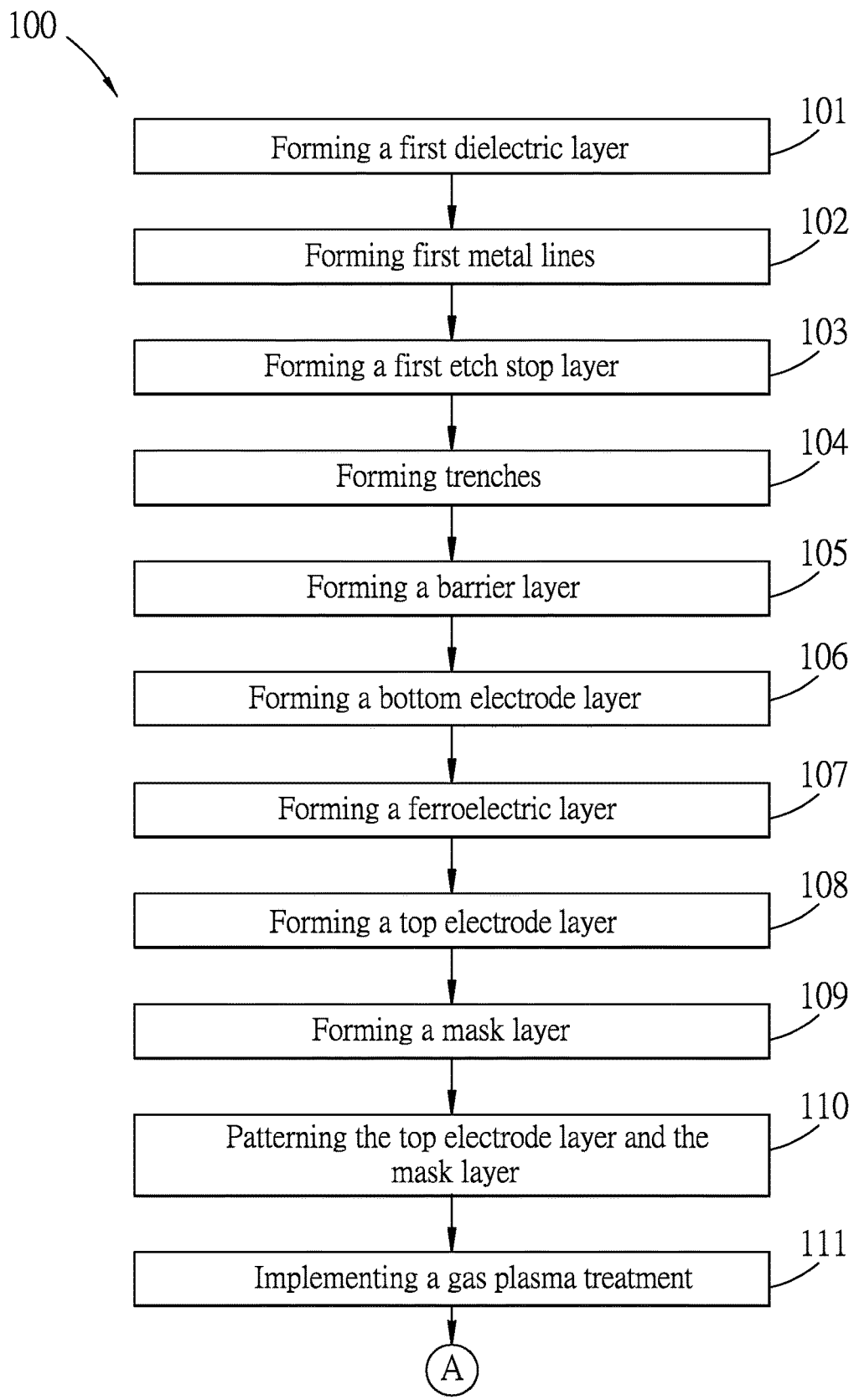
FIGS. 1A and 1B are flow diagrams illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device, and methods for manufacturing the same. Especially, embodiments include a semiconductor device located in the back-end of line (BEOL).

A ferroelectric random-access memory (FeRAM) device includes a top electrode, a bottom electrode, a ferroelectric layer, and a sidewall spacer, and may be, for example, but not limited to, a ferroelectric memory cell. The ferroelectric layer is disposed between the top electrode and the bottom electrode, and is used to store one or more bits of data. The sidewall spacer is disposed on a peripheral region of the ferroelectric layer aside the top electrode. For example, in the manufacturing process of a FeRAM device that has an area that is not greater than 0.25 $\mu m^2$, the ferroelectric layer might be adversely affected during etching processes for forming the top electrode and the sidewall spacer, such that a crystal phase of the peripheral region of the ferroelectric layer beneath the sidewall spacer might be transformed from a ferroelectric phase to a non-ferroelectric phase, which may degrade the ferroelectric characteristics of the FeRAM device and may lead to a large response variation thereof.

Figure 1B:
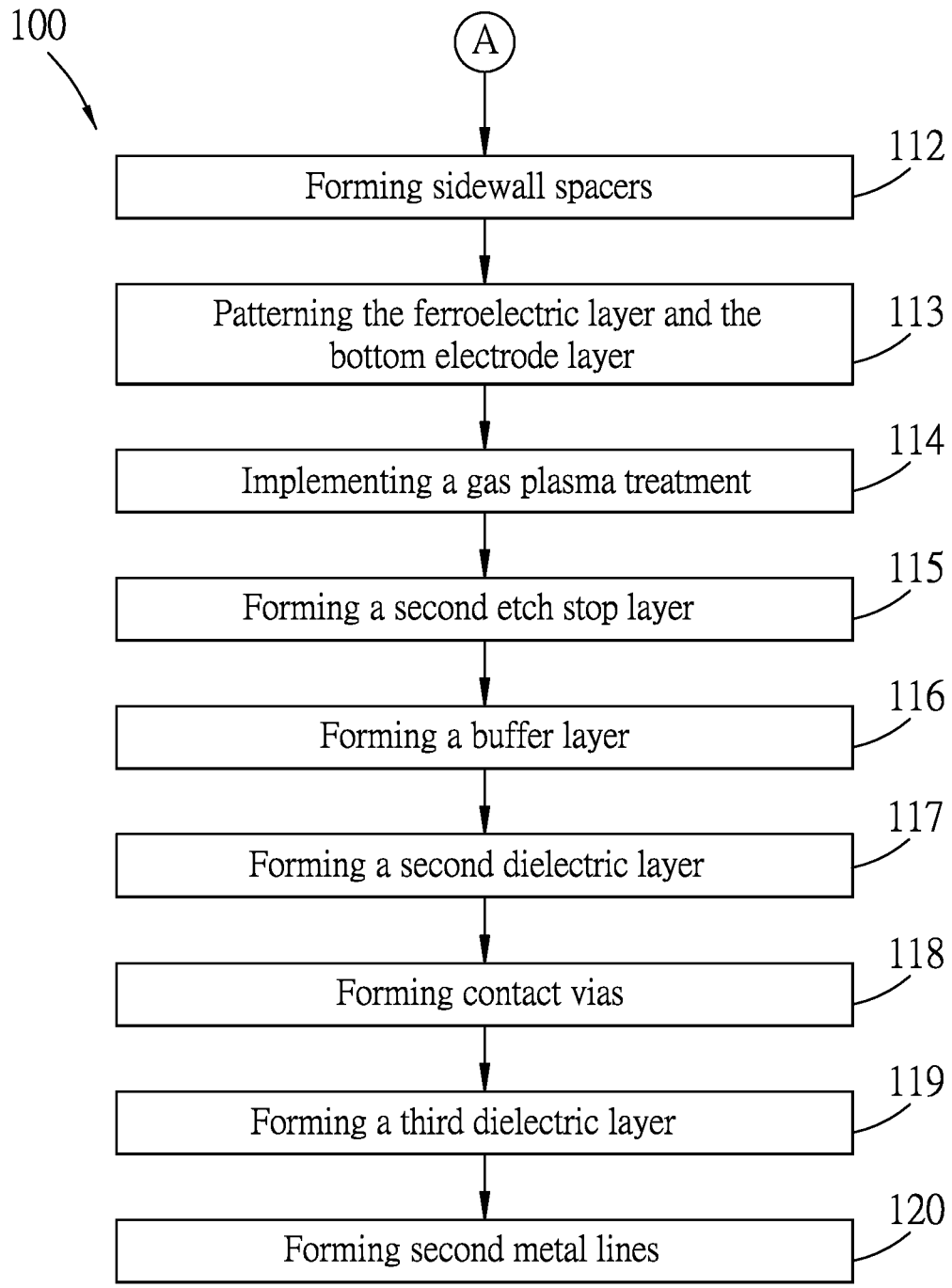

FIGS. 1A and 1B are flow diagrams illustrating a method 100 for manufacturing a semiconductor device (for example, a semiconductor device 200 shown in FIG. 25) in accordance with some embodiments. FIGS. 2 to 25 illustrate schematic views of the intermediate stages of the method 100.

Figure 2:
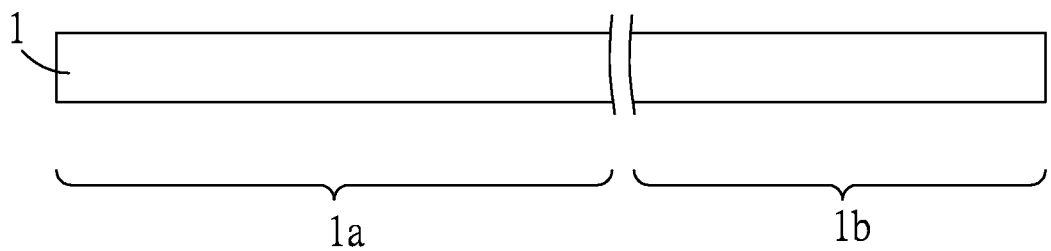
FIGS. 2 to 25 are schematic views illustrating intermediate stages of the manufacturing method in accordance with some embodiments as depicted in FIGS. 1A and 1B.

Referring to FIGS. 1A and 2, the method 100 begins at step 101, where a first dielectric layer 1 is formed. In some embodiments, the first dielectric layer 1 may be formed using, for example, chemical vapor deposition (CVD), physical vapor deposition (PVD), or other suitable deposition techniques. In some embodiments, the first dielectric layer 1 may include, but not limited to, silicon oxide, silicon nitride, silicon carbide, silicon oxycarbide, silicon oxynitride, silicon carbonitride, silicon oxycarbonitride, undoped silicate glass (USG), phosphosilicate glass (PSG), borosilicate glass (BSG), boron-doped phosphosilicate glass (BPSG), fluorine-doped silicate glass (FSG), other suitable dielectric materials, or combinations thereof. In alternative embodiments, the first dielectric layer 1 may include, but not limited to, polyimide, epoxy resin, acrylic resin, phenol resin, benzocyclobutene (BCB), polybenzooxazole (PBO), other suitable polymer-based dielectric materials, or combinations thereof. In some embodiments, the first dielectric layer 1 may include a device memory region 1a and a device peripheral region 1b. Other suitable materials for the first dielectric layer 1 are within the contemplated scope of the present disclosure. In some embodiments, the first dielectric layer 1 may be an interlayer dielectric (ILD) layer.

Figure 3:
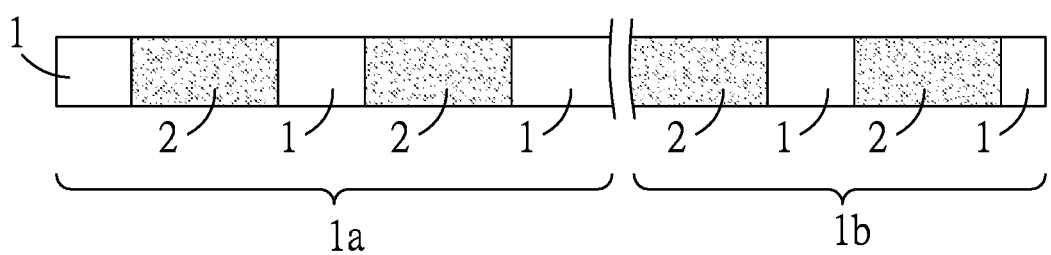

Referring to FIGS. 1A and 3, the method 100 proceeds to step 102, where first metal lines 2 are formed in the first dielectric layer 1. Step 102 may be implemented by (i) patterning the first dielectric layer 1 to form first recesses (not shown), (ii) depositing a metallic material on the first dielectric layer 1 to fill the first recesses, and (iii) removing the excess metallic material on the first dielectric layer 1. In some embodiments, the first dielectric layer 1 is patterned using known photolithography and etching processes. The photolithography process may include, for example, but not limited to, coating a photoresist, soft-baking, exposing the photoresist through a photomask, post-exposure baking, and developing the photoresist, followed by hard-baking so as to form a patterned photoresist. The etching process may be implemented by etching the first dielectric layer 1 through the patterned photoresist using, for example, dry etching, wet etching, a combination thereof, or other suitable etching techniques. In some embodiments, the deposition of the metallic material for the first metal lines 2 may be implemented using, for example, CVD, PVD, electroless plating, electroplating, or other suitable deposition techniques. In some embodiments, the first metal lines 2 may include, but not limited to, copper, aluminum, tungsten, or combinations thereof. Other suitable materials for the first metal lines 2 are within the contemplated scope of the present disclosure. In some embodiments, the removal of the excess metallic material may be implemented using, for example, chemical mechanical polishing (CMP), or other suitable planarization techniques. In some embodiments, each of the first metal lines 2 may be replaced by a contact via.

Figure 4:
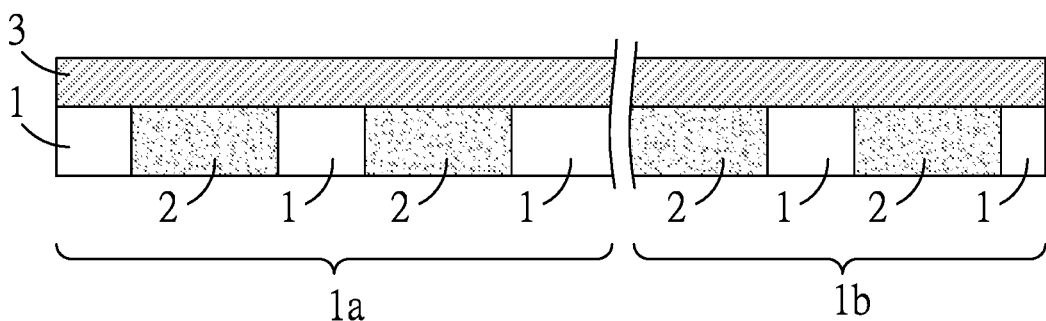

Referring to FIGS. 1A and 4, the method 100 proceeds to step 103, where a first etch stop layer 3 is formed on the first dielectric layer 1 and the first metal lines 2. In some embodiments, the first etch stop layer 3 may be formed using, for example, CVD, plasma-enhanced chemical vapor deposition (PECVD), atomic layer deposition (ALD), spin-on coating, electroless plating, or other suitable deposition techniques. In some embodiments, the first etch stop layer 3 may include, but not limited to, metal nitride, metal oxide, metal carbide, silicon nitride, silicon oxide, silicon carbide, silicon oxynitride, or combinations thereof. Other suitable materials for the first etch stop layer 3 are within the contemplated scope of the present disclosure. In some embodiments, after step 103, a top surface of the first etch stop layer 3 may be planarized using, for example, CMP, or other suitable planarization techniques.

Figure 5:
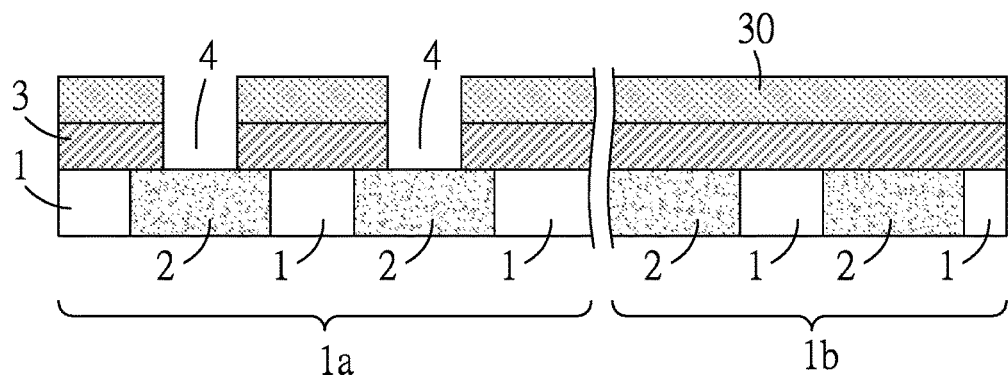

Referring to FIGS. 1A and 5, the method 100 proceeds to step 104, where trenches 4 are formed in the first etch stop layer 3 on the memory region 1a to expose the first metal lines 2 in the memory region 1a. Step 104 may be implemented by patterning the first etch stop layer 3 using a patterned photoresist layer 30 to form the trenches 4. The patterning process may include known photolithography and etching processes as described above in step 102, and the details thereof are omitted for the sake of brevity. The patterned photoresist layer 30 may be removed after step 104. Other suitable techniques may be used for patterning the first etch stop layer 3.

Figure 6:
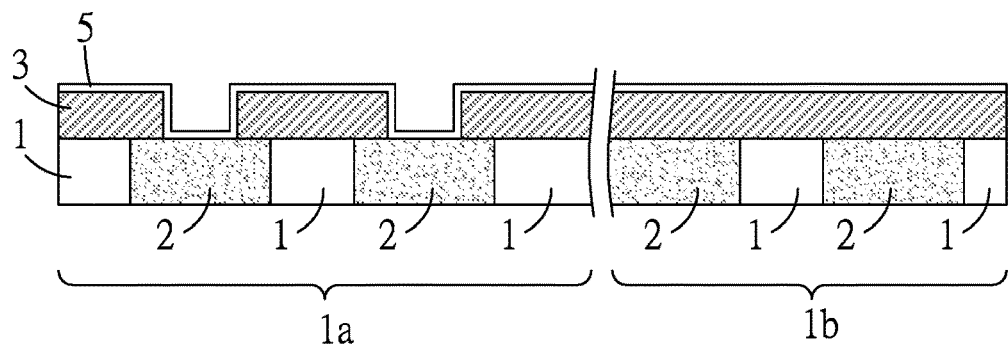

Referring to FIGS. 1A and 6, the method 100 proceeds to step 105, where a barrier layer 5 is conformally formed on the top surface of the first etch stop layer 3 and inner surfaces of the trenches 4 (see FIG. 5). In some embodiments, the barrier layer 5 may be formed using, for example, CVD, metal organic chemical vapor deposition (MOCVD), PVD, ALD, or other suitable deposition techniques. In some embodiments, the barrier layer 5 may include, but not limited to, titanium nitride, platinum, aluminum copper, gold, titanium, tantalum, tantalum nitride, tungsten, tungsten nitride, alloys thereof, or combinations thereof. Other suitable materials for the barrier layer 5 are within the contemplated scope of the present disclosure. The barrier layer 5 is in direct contact with the first metal lines 2 in the trenches 4.

Figure 7:
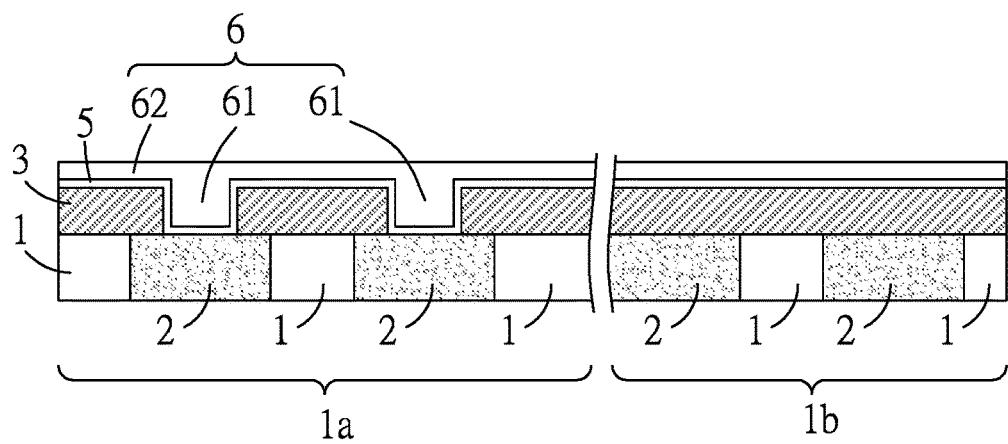
Figure 7A:
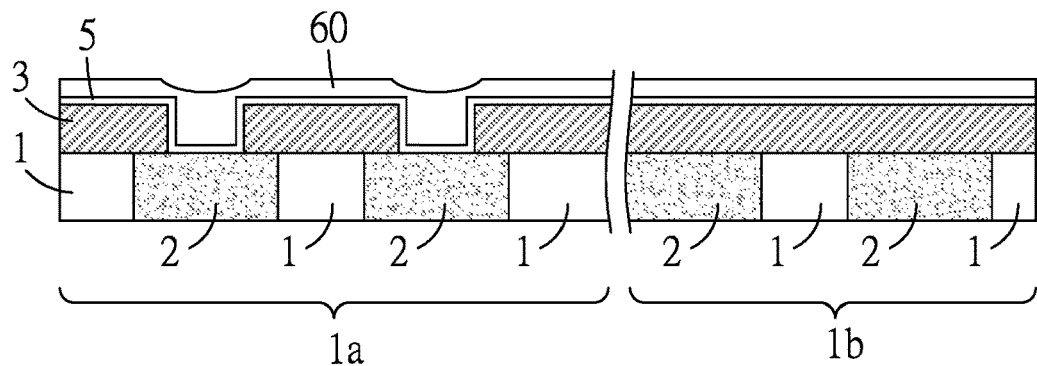
Figure 8:
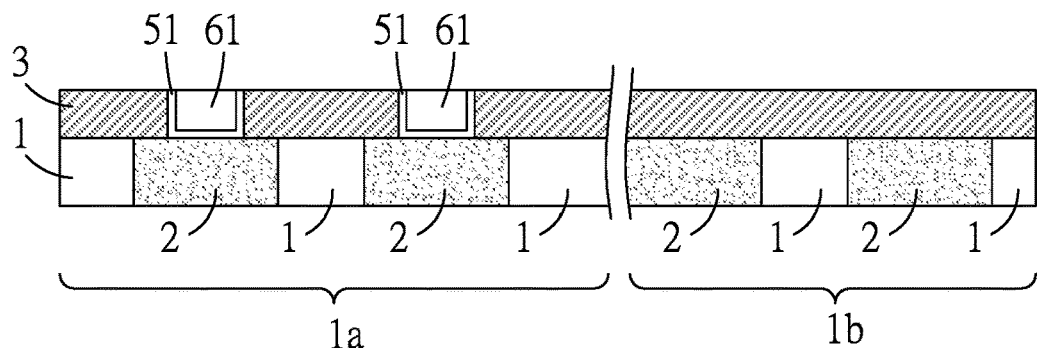
Figure 9:
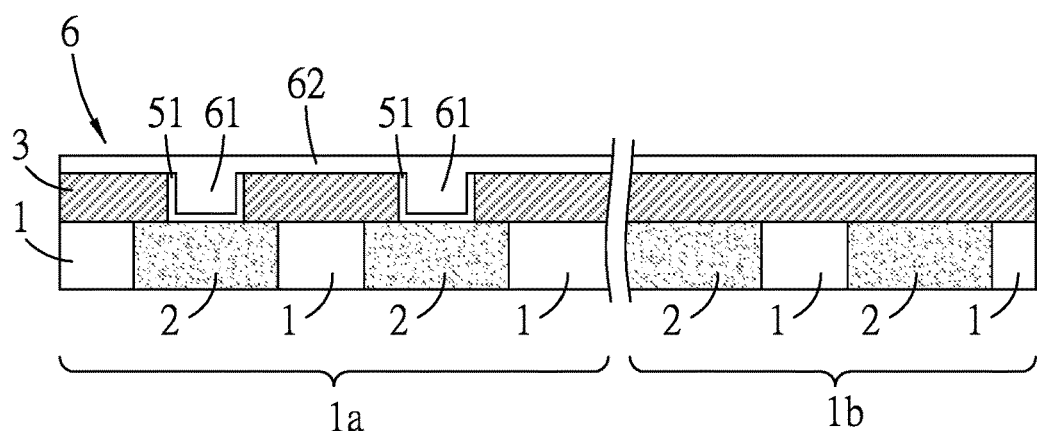
Figure 16:
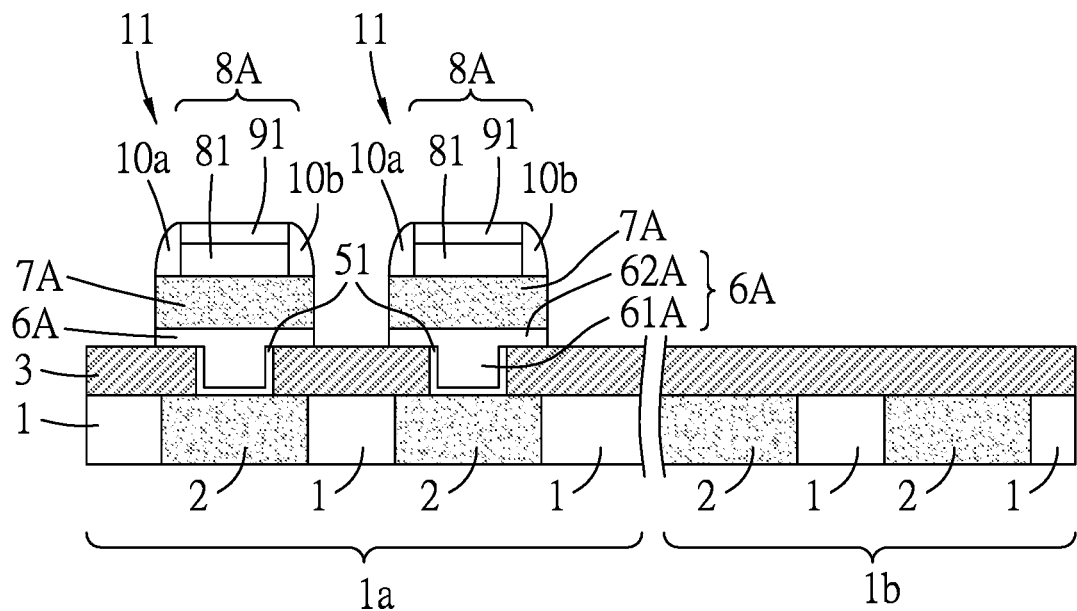

Referring to FIGS. 1A and 7, the method 100 proceeds to step 106, where a bottom electrode layer 6 is formed on the barrier layer 5 and fills the trenches 4 (see FIG. 5). In some embodiments, the bottom electrode layer 6 may include, but not limited to, titanium nitride, platinum, aluminum copper, gold, titanium, tantalum, tantalum nitride, tungsten, tungsten nitride, alloys thereof, or combinations thereof. Other suitable materials for the bottom electrode layer 6 are within the contemplated scope of the present disclosure. The bottom electrode layer 6 is electrically connected to the first metal lines 2 through the barrier layer 5. In some embodiments, the bottom electrode layer 6 and the barrier layer 5 may be made of different materials. The bottom electrode layer 6 includes filler portions 61 filling the trenches 4, and a layer portion 62 disposed on the first etch stop layer 3 to cover the filler portions 61. In some embodiments, step 106 includes (i) depositing an electrode material layer over the structure of FIG. 6 using, for example, CVD, PVD, ALD, or other suitable deposition techniques, and (ii) planarizing the electrode material layer on the first etch stop layer 3 using, for example, CMP, or other suitable planarization techniques, to thereby obtain the filler portions 61 and the layer portion 62 of the bottom electrode layer 6 shown in FIG. 7. In alternative embodiments, step 106 includes (i) depositing an electrode material layer 60 over the structure of FIG. 6 using, for example, CVD, PVD, ALD, or other suitable deposition techniques to obtain a structure shown in FIG. 7A, (ii) removing the excess electrode material layer 60 and the excess barrier layer 5 on the first etch stop layer 3 using, for example, CMP, or other suitable planarization techniques, so as to form the electrode material layer 60 shown in FIG. 7A into the filler portions 61 and so as to form the barrier layer 5 into lower barriers 51 (see FIG. 8), and (iii) further depositing another electrode material layer, which serves as the layer portion 62 of the bottom electrode layer 6, on the first etch stop layer 3 and the filler portions 61 (see FIG. 9). The filler portions 61 and the layer portion 62 may be made of the same material or different materials. The provision of the lower barriers 51 may prevent diffusion of metal in the first metal lines 2 into bottom electrodes 6A which are shown in FIG. 16 and which are formed thereafter by patterning the bottom electrode layer 6. For the sake of simplicity, the configuration of FIG. 9 will be used for subsequent figures.

Figure 10:
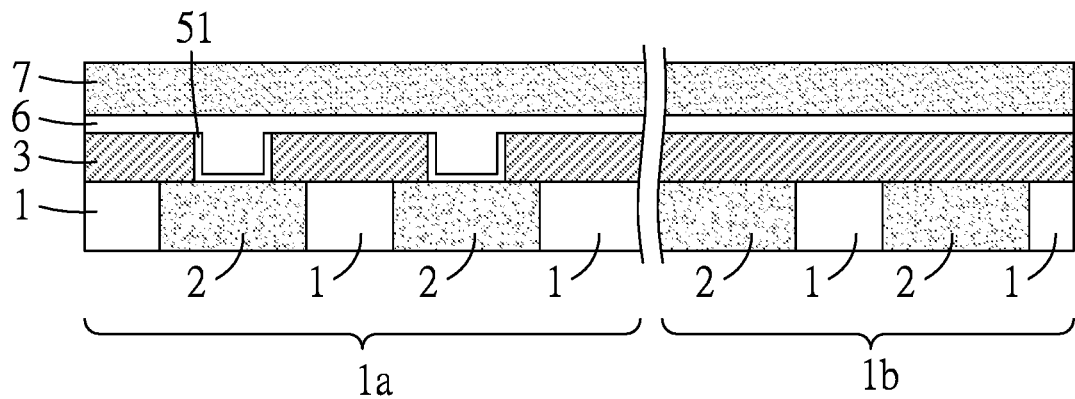

Referring to FIGS. 1A and 10, the method 100 proceeds to step 107, where a ferroelectric layer 7 is formed on the bottom electrode layer 6 opposite to the first etch stop layer 3. The ferroelectric layer 7 includes a ferroelectric material, and may include binary oxides, ternary oxides, quaternary oxides, other suitable oxides, or combinations thereof. The binary oxides may include, for example, but not limited to, hafnium oxide (hafnia, $HfO_2$) or other suitable materials. The ternary oxides may include, for example, but not limited to, hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), doped $HfO_2$ (the dopants may include Y, Sc, Ga, Gd, combinations thereof, or other suitable dopants), other suitable materials, or combinations thereof. The quaternary oxides may include, for example, but not limited to, lead zirconate titanate ($PbZr_xTi_yO_z$), barium strontium titanate ($BaSrTiO_x$), strontium bismuth tantalate ($SrBi_2Ta_2O_9$), or combinations thereof. Other suitable ferroelectric materials for the ferroelectric layer 7 are within the contemplated scope of the present disclosure. In some embodiments, the ferroelectric layer 7 may be formed using, for example, such as CVD, PVD, ALD, plasma-enhanced ALD, molecular beam epitaxy (MBE), or other suitable deposition techniques. In some embodiments, the ferroelectric layer 7 may be constructed in a single-layer form. In alternative embodiments, the ferroelectric layer 7 may include a plurality of films with different materials.

Figure 11:
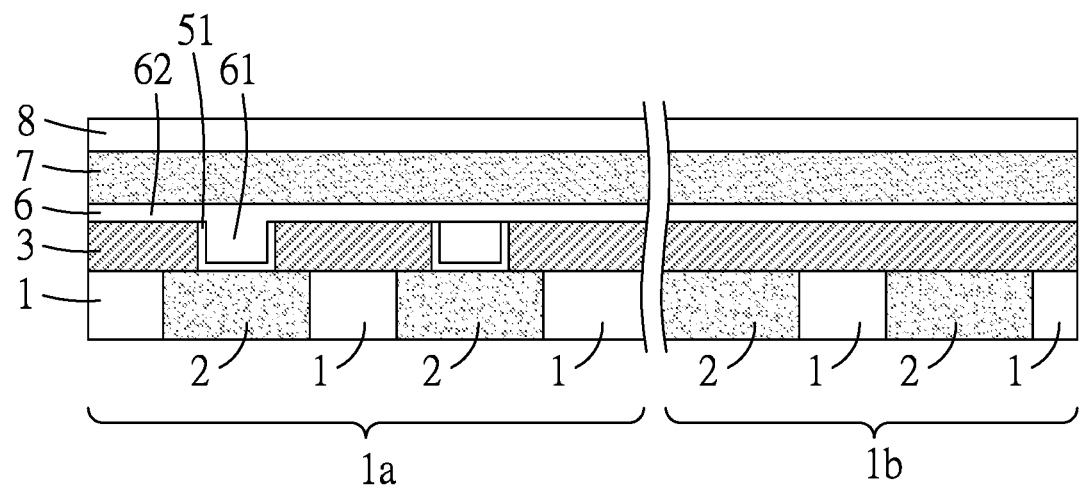

Referring to FIGS. 1A and 11, the method 100 proceeds to step 108, where a top electrode layer 8 is formed on the ferroelectric layer 7 opposite to the bottom electrode layer 6. In some embodiments, the top electrode layer 8 may be formed using, for example, CVD, PVD, ALD, or other suitable deposition techniques. In some embodiments, the top electrode layer 8 may include, but not limited to, titanium nitride, platinum, aluminum copper, gold, titanium, tantalum, tantalum nitride, tungsten, tungsten nitride, alloys thereof, or combinations thereof. Other suitable materials for the top electrode layer 8 are within the contemplated scope of the present disclosure. In some embodiments, the top electrode layer 8 may be constructed in a single-layer form. In alternative embodiments, the top electrode layer 8 may include a plurality of films with different materials.

Figure 12:
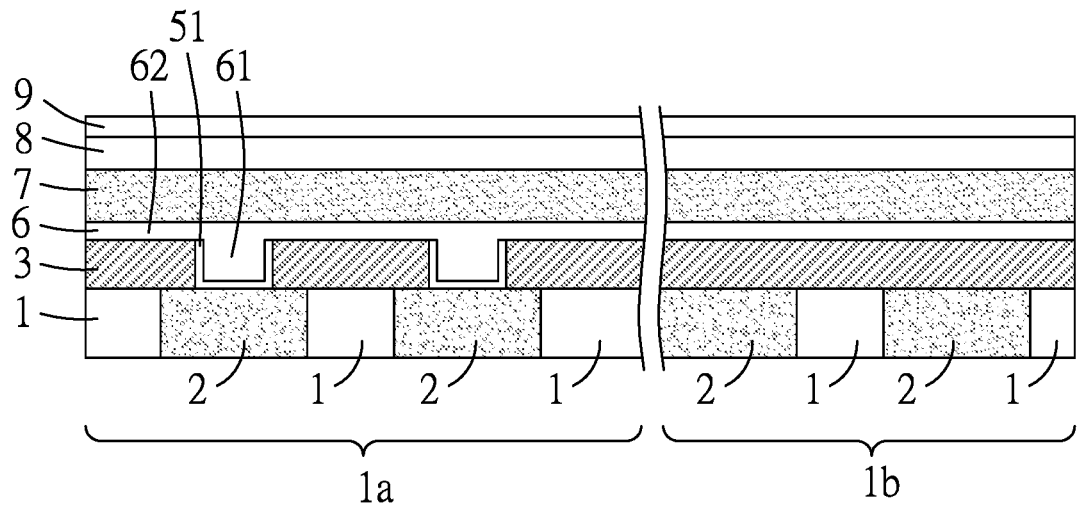

Referring to FIGS. 1A and 12, the method 100 proceeds to step 109, where a mask layer 9 is formed on the top electrode layer 8 opposite to the ferroelectric layer 7. In some embodiments, the mask layer 9 may be formed using, for example, CVD, PVD, ALD, or other suitable deposition techniques. In some embodiments, the mask layer 9 may be a hard mask layer, and may include, but not limited to, titanium nitride, silicon oxide, silicon nitride, silicon carbide nitride, silicon oxide nitride, metal oxide (e.g., titanium oxide, aluminum oxide or the like), or combinations thereof. Other suitable materials for the mask layer 9 are within the contemplated scope of the present disclosure.

Figure 13:
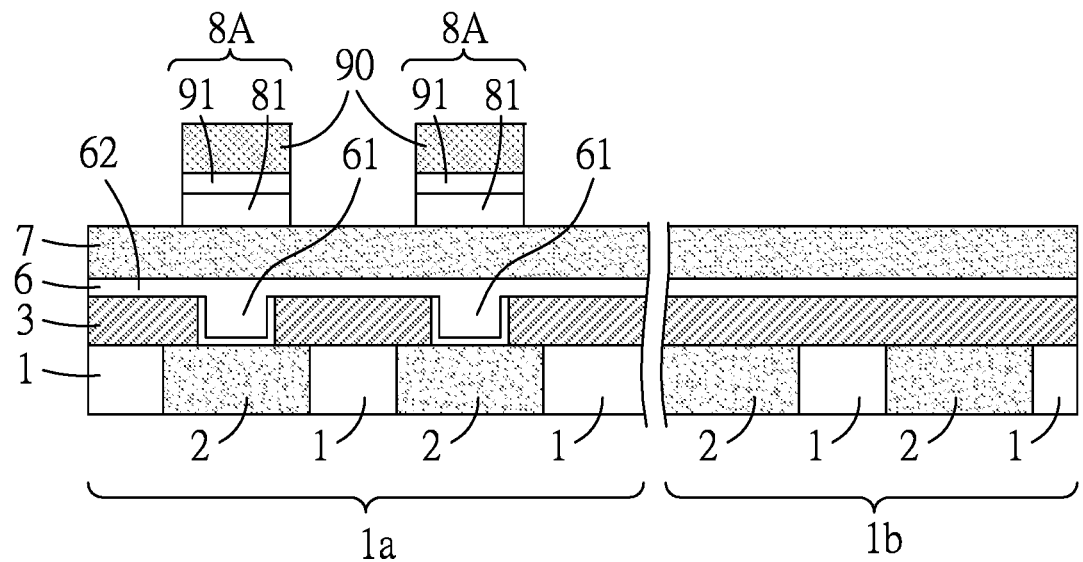

Referring to FIGS. 1A and 13, the method 100 proceeds to step 110, where the top electrode layer 8 and the mask layer 9 shown in FIG. 12 are patterned using a patterned photoresist layer 90 to form top electrodes 81 and masks 91 on the device memory region 1a. The patterning process may include known photolithography and etching processes as described above in step 102, and the details thereof are omitted for the sake of brevity. After step 110, a plurality of stacks 8A are formed in positions corresponding to the filler portions 61 of the bottom electrode layer 6, respectively. Each of the stacks 8A includes one of the top electrodes 81, and a corresponding one of the masks 91 formed thereon. The patterned photoresist layer 90 may be removed after step 110. Other suitable techniques may be used for patterning the top electrode layer 8 and the mask layer 9.

Figure 14:
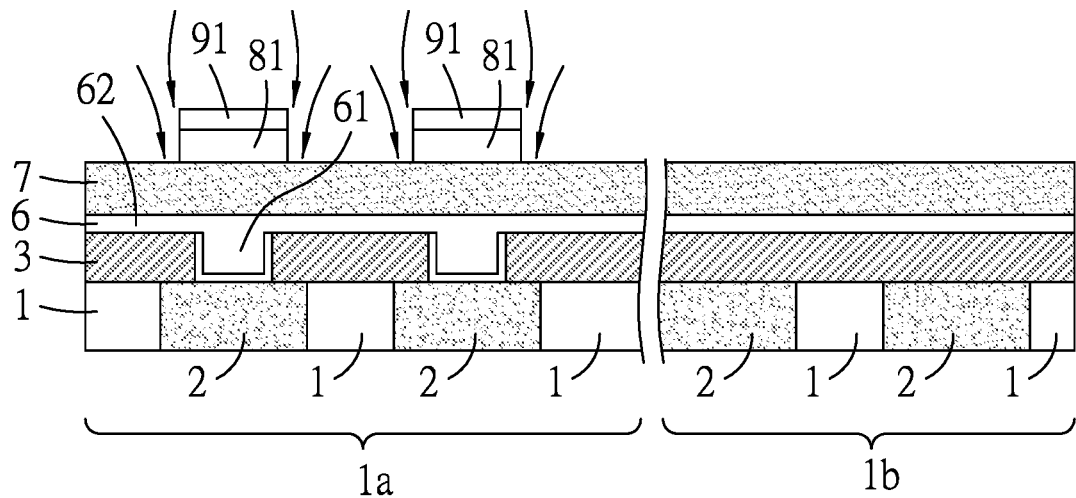

Referring to FIGS. 1A and 14, the method 100 proceeds to step 111, where a gas plasma treatment is implemented to treat the ferroelectric layer 7, thereby transforming a non-ferroelectric phase of the ferroelectric layer 7 to a ferroelectric phase. The non-ferroelectric phase of the ferroelectric layer 7 may be formed during the etching process in step 110. In some embodiments, the gas plasma treatment may be implemented using a source gas (for example, but not limited to, ammonia ($NH_3$), oxygen ($O_2$), ozone ($O_3$), hydrogen ($H_2$), nitrous oxide ($N_2O$), $H_2O$, other suitable source gases, or combinations thereof), and a carrier gas (e.g., helium (He), argon (Ar), other suitable carrier gases, or combinations thereof). In some embodiments, the plasma generation power used in this step may range from about 200 W to about 1000 W, such as about 600 W. In some embodiments, the gas plasma treatment time may range from about 20 seconds to about 200 seconds, such as about 60 seconds.

Figure 15:
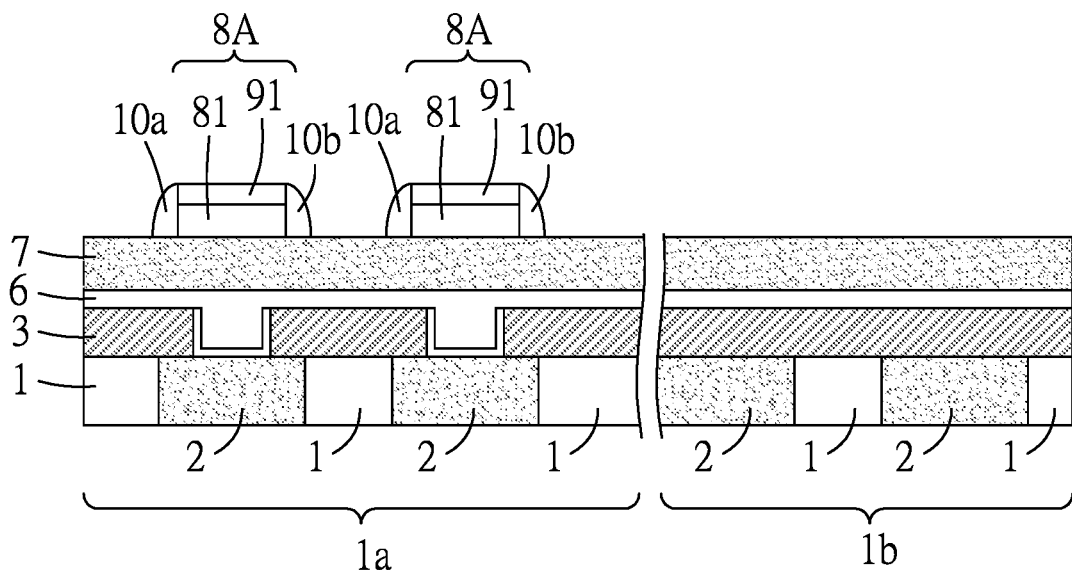

Referring to FIGS. 1B and 15, the method 100 proceeds to step 112, where a pair of sidewall spacers 10a, 10b are respectively formed at two lateral sides of each of the stacks 8A. In some embodiments, step 112 includes (i) depositing a sidewall spacer material layer (not shown) over the structure of FIG. 14 using, for example, CVD, PVD, ALD, or other suitable deposition techniques, and (ii) anisotropically etching (e.g., dry etching, wet etching, a combination thereof, or other suitable etching techniques) the sidewall spacer material layer to permit the sidewall spacers 10a, 10b to be formed on the lateral sides of each of the stacks 8A. The sidewall spacers 10a, 10b may include, for example, but not limited to, silicon nitride, a multilayer oxide-nitride-oxide film, un-doped silicate glass, or combinations thereof. Other suitable materials for the sidewall spacers 10a, 10b are within the contemplated scope of the present disclosure.

Figure 17:
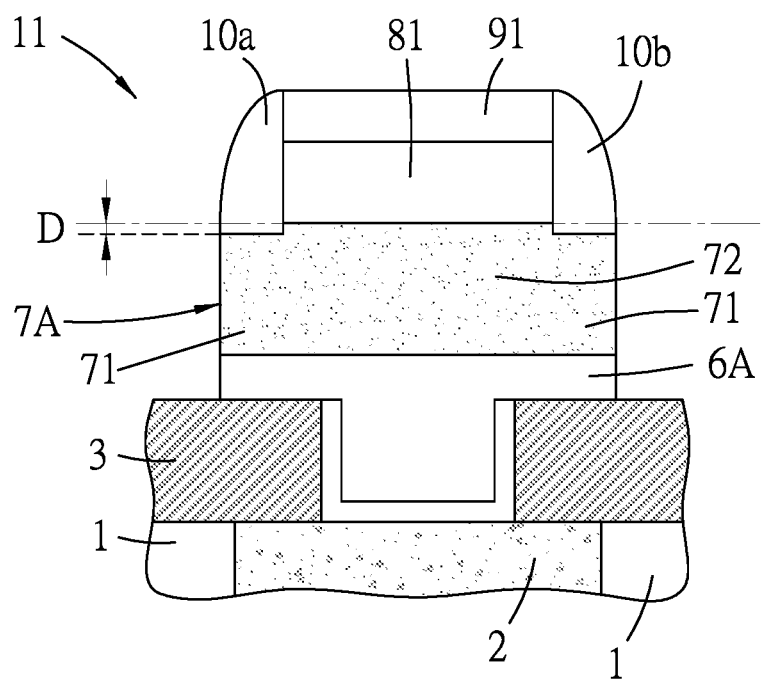
Figure 18:
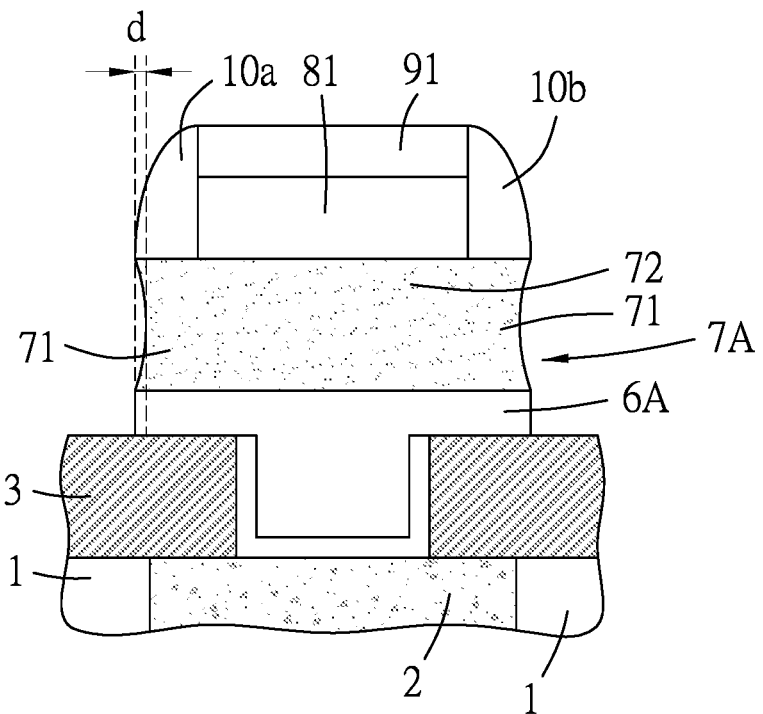

Referring to FIGS. 1B and 16, the method 100 proceeds to step 113, where the ferroelectric layer 7 and the bottom electrode layer 6 are patterned. That is, the ferroelectric layer 7 and the bottom electrode layer 6, which are exposed from the stacks 8A and the sidewall spacers 10a, 10b, are etched such that the ferroelectric layer 7 shown in FIG. 15 is formed into data storage elements 7A which are disposed on the device memory region 1a, and such that the bottom electrode layer 6 shown in FIG. 15 is formed into bottom electrodes 6A which are disposed on the device memory region 1a. After step 113, ferroelectric memory cells 11 are formed, and each of the ferroelectric memory cells 11 may include one of the lower barriers 51, a corresponding one of the bottom electrodes 6A, a corresponding one of the data storage elements 7A, a corresponding one of the top electrodes 81, a corresponding one of the masks 91, and a corresponding pair of the sidewall spacers 10a, 10b. Each of the bottom electrodes 6A includes a first portion 61A which corresponds to one of the filler portions 61, and a second portion 62A which is formed on the first portion 61A. In some embodiments, the ferroelectric layer 7 and the bottom electrode layer 6 are etched using, for example, dry etching, wet etching, a combination thereof, or other suitable etching techniques. FIG. 17 is a fragmentary enlarged view of FIG. 16 in accordance with some embodiments. Each of the data storage elements 7A includes two peripheral regions 71 beneath the sidewall spacers 10a, 10b, and a main region 72 beneath a corresponding one of the top electrodes 81. Each of the sidewall spacers 10a, 10b may extend into a respective one of the peripheral regions 71 of the data storage elements 7A in a depth (D) that is not greater than 5 nm. FIG. 18 is similar to FIG. 17 but illustrates that each of the peripheral regions 71 of the data storage elements 7A may be laterally recessed by a distance (d) that is not greater than 5 nm.

Figure 19:
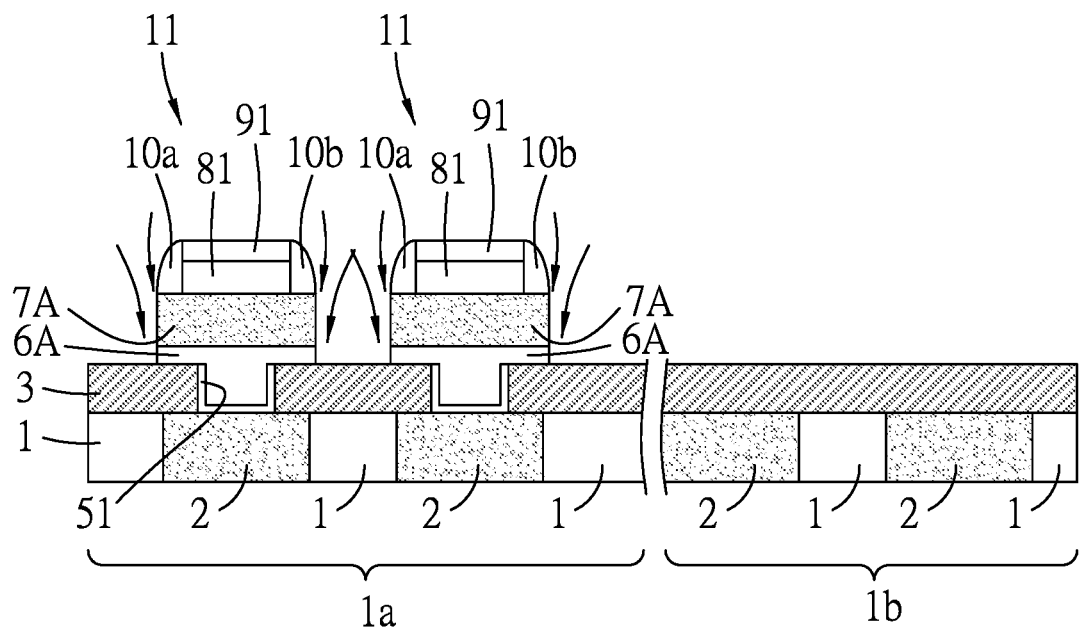

Referring to FIGS. 1B and 19, the method 100 proceeds to step 114, where a gas plasma treatment is implemented to treat the ferroelectric material of the data storage elements 7A which are formed after an etching process of step 113. In this step, the plasma generation source and the parameters for generating the plasma (e.g., the plasma generation power, or the treatment time) may be similar to those described in step 111. The gas plasma treatment of step 114 may be implemented in a similar manner as described in step 111. In some embodiments, both step 111 and step 114 are implemented, while in alternative embodiments, only one of step 111 and step 114 is implemented. After the gas plasma treatment, each of the peripheral regions 71 of the data storage elements 7A has at least 60% of ferroelectric phase. In some embodiments, the ferroelectric phase of each of the peripheral regions 71 may be present in a range from about 60% to about 95%. In some embodiments, the ferroelectric phase percentage (%) of each of the peripheral regions 71 may be referred to as an area fraction of the ferroelectric phase in a cut surface of the peripheral region 71, based on a total surface area of the cut surface of the peripheral region 71. The crystal phase of the cut surface of the peripheral region 71 may be observed using a crystallographic characterization technique, for example, electron back scatter diffraction (EBSD), X-ray diffraction (XRD), precession electron diffraction (PED), or other suitable techniques.

In some embodiments, the ferroelectric layer 7 is made of hafnium zirconate (HfZrO$_x$), barium titanate (BaTiO$_3$), or lead zirconate titanate (PZT). In the case that the gas plasma treatment is not applied, the ferroelectric phase of the peripheral regions 71 of the data storage elements 7A may be present in a range from about 20% to about 40%. In the case that the gas plasma treatment is applied in step 111 and/or step 114, the ferroelectric phase of the peripheral regions 71 may be present in a range from about 60% to about 95%. Please note that the ferroelectric phase of hafnium zirconate may be orthorhombic phase, the ferroelectric phase of barium titanate may be tetragonal phase, and the ferroelectric phase of lead zirconate titanate may be monoclinic phase.

Figure 20:
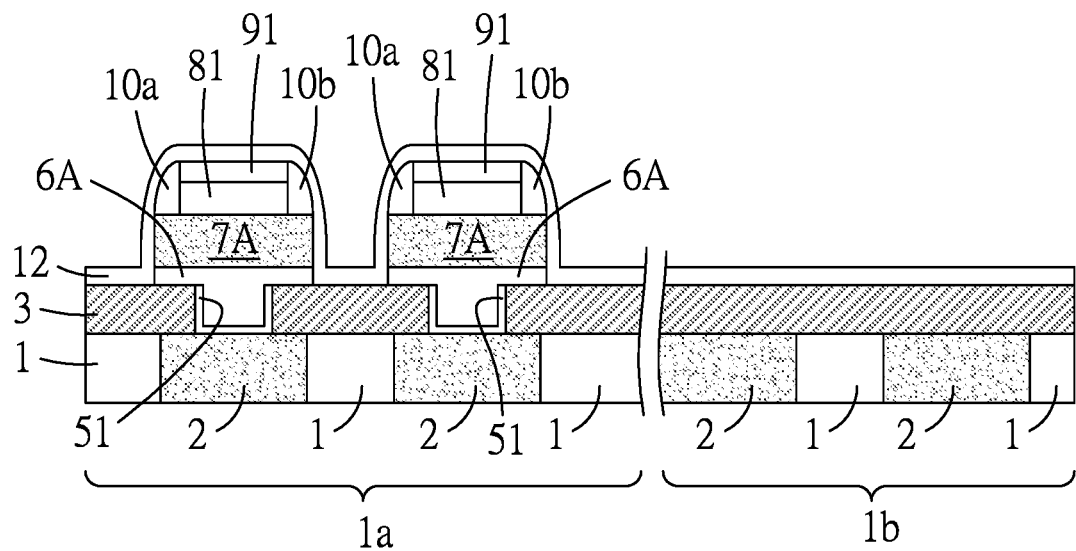

Referring to FIGS. 1B and 20, the method 100 proceeds to step 115, where a second etch stop layer 12 is conformally formed on the structure shown in FIG. 19. In some embodiments, the second etch stop layer 12 may be formed using, for example, CVD, PECVD, ALD, spin-on coating, electroless plating, or other suitable deposition techniques. In some embodiments, the second etch stop layer 12 may include metal nitride, metal oxide, metal carbide, silicon nitride, silicon oxide, silicon carbide, silicon oxynitride, or combinations thereof. Other suitable materials for the second etch stop layer 12 are within the contemplated scope of the present disclosure.

Figure 21:
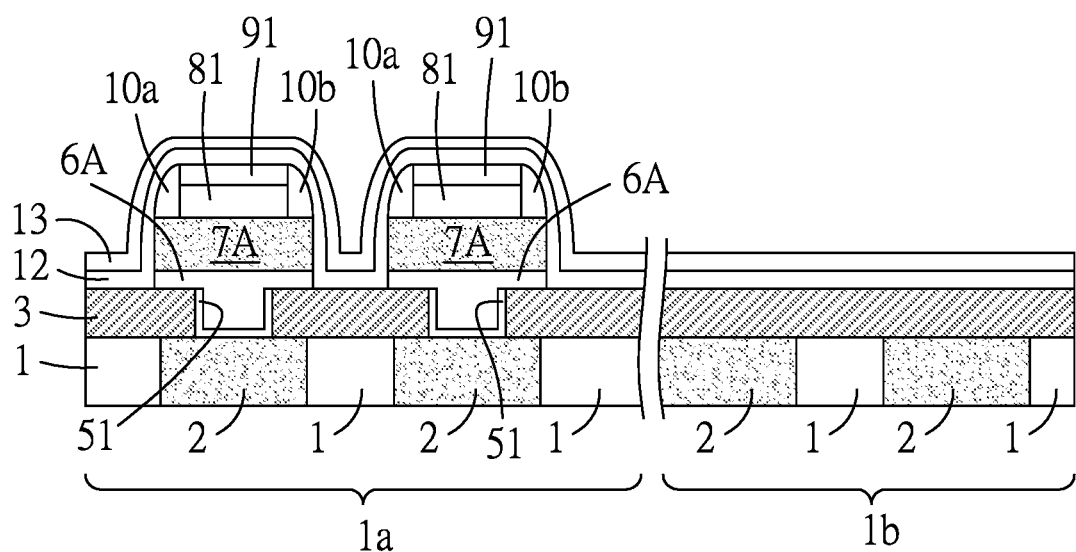

Referring to FIGS. 1B and 21, the method 100 proceeds to step 116, where a buffer layer 13 is formed on the second etch stop layer 12. In some embodiments, the buffer layer 13 may be conformally formed using, for example, CVD, PECVD, or other suitable deposition techniques. In some embodiments, the buffer layer 13 may be made of tetraethyl orthosilicae (TEOS). Other suitable materials for the buffer layer 13 are within the contemplated scope of the present disclosure.

Figure 22:
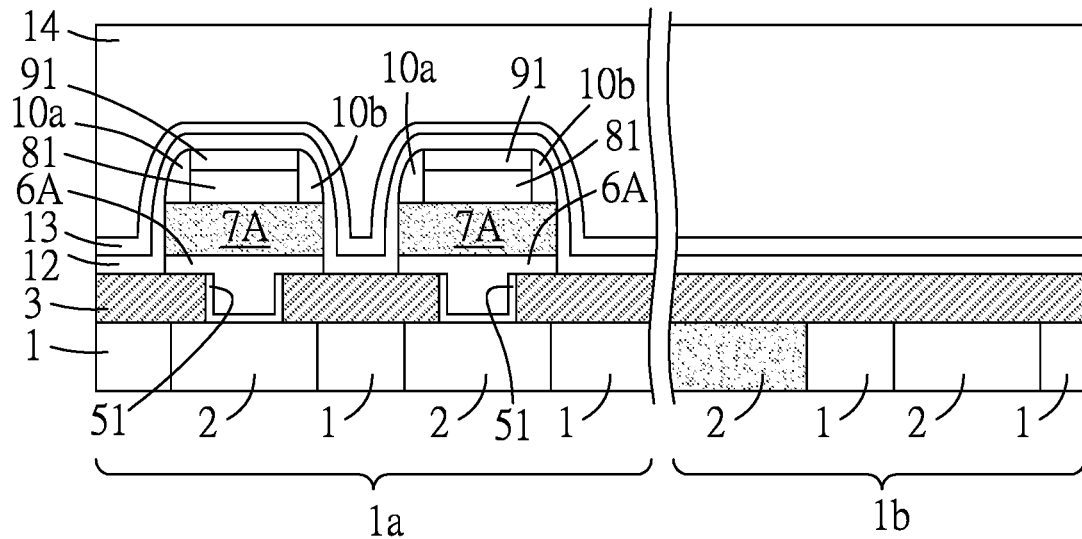

Referring to FIGS. 1B and 22, the method 100 proceeds to step 117, where a second dielectric layer 14 is formed on the buffer layer 13. In some embodiments, the second dielectric layer 14 may be formed using, for example, CVD, PVD, or other suitable deposition techniques, followed by planarization through, such as CMP or other suitable techniques. The materials for the second dielectric layer 14 may be similar to those for the first dielectric layer 1, and the details thereof are omitted for the sake of brevity.

Figure 23:
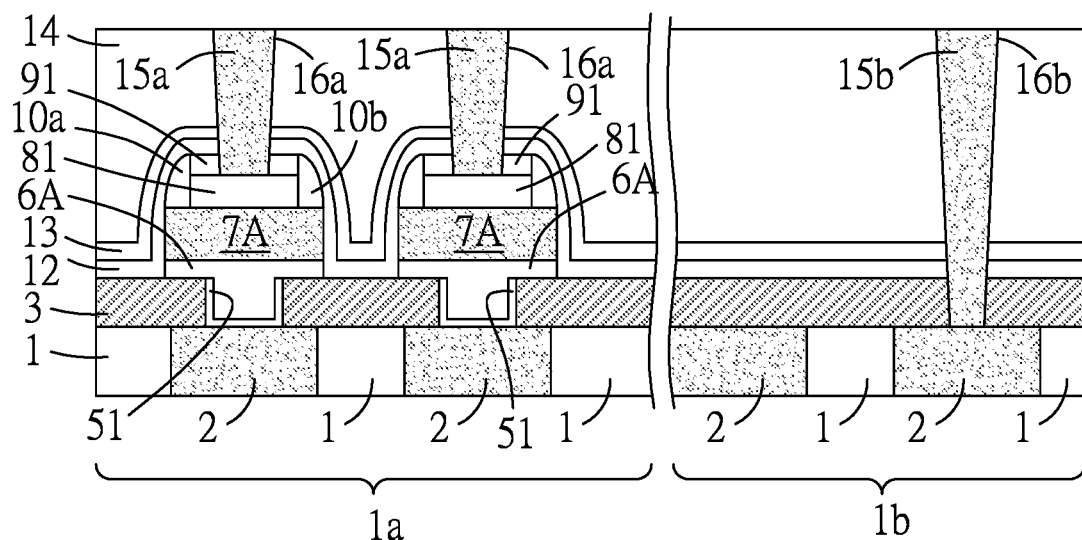

Referring to FIGS. 1B and 23, the method 100 proceeds to step 118, where contact vias 15a, 15b are formed in the second dielectric layer 14. Step 118 may be implemented by (i) patterning the second dielectric layer 14 to form second trenches 16a, 16b, (ii) depositing a contact material for the contact vias 15a, 15b on the second dielectric layer 14 to fill the second trenches 16a, 16b, and (iii) removing the excess contact material on the second dielectric layer 14. Each of the second trenches 16a penetrates the second dielectric layer 14, the buffer layer 13, the second etch stop layer 12 and the masks 91 to expose a corresponding one of the top electrodes 81 on the device memory region 1a. The second trench 16b penetrates the second dielectric layer 14, the buffer layer 13, the second etch stop layer 12 and the first etch stop layer 3 to expose a corresponding one of the first metal lines 2 on the device peripheral region 1b. In some embodiments, the deposition of the contact material may be implemented using, for example, CVD, PVD, electroless plating, electroplating, or other suitable deposition techniques. In some embodiments, the contact vias 15a, 15b may include, but not limited to, copper, aluminum, tungsten, or combinations thereof. Other suitable materials for the contact vias 15a, 15b are within the contemplated scope of the present disclosure. In some embodiments, the removal of the excess contact material may be implemented using, for example, CMP, or other suitable planarization techniques. The contact vias 15a filling the second trenches 16a are electrically and respectively connected to the top electrodes 81 of the data storage elements 7A on the device memory region 1a. The contact via 15b filling the second trench 16b is electrically and directly connected to the corresponding one of the first metal lines 2 on the device peripheral region 1b.

Figure 24:
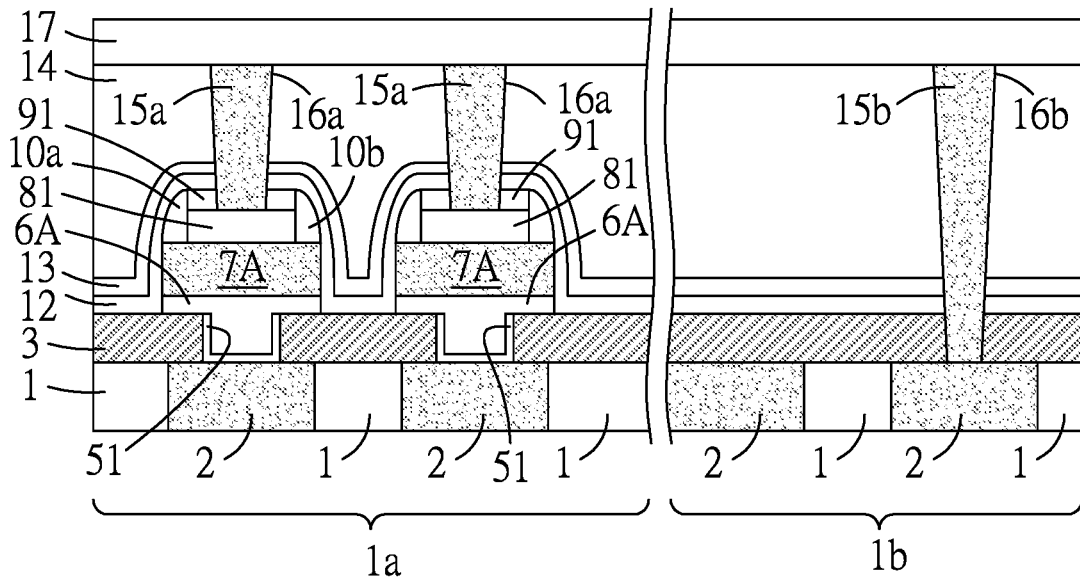

Referring to FIGS. 1B and 24, the method 100 proceeds to step 119, where a third dielectric layer 17 is formed on the second dielectric layer 14 and the contact vias 15a, 15b. In some embodiments, the material and formation for the third dielectric layer 17 may be similar to those for the first dielectric layer 1, and the details thereof are omitted for the sake of brevity.

Figure 25:
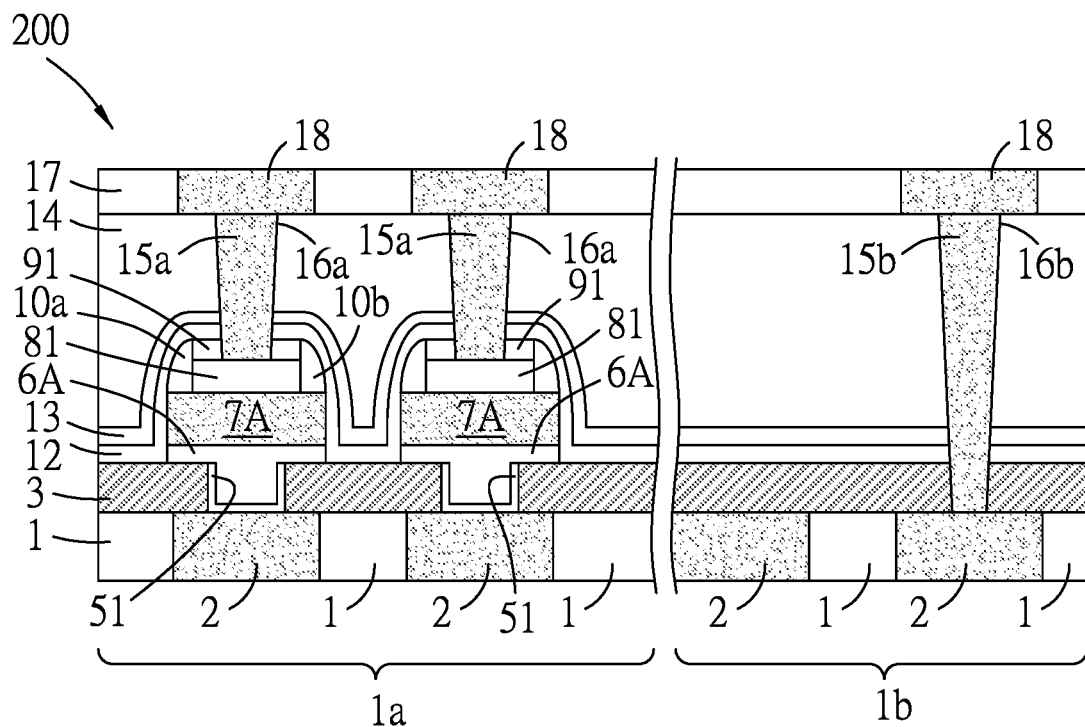

Referring to FIGS. 1B and 25, the method 100 proceeds to step 120, where second metal lines 18 are formed in the third dielectric layer 17 such that the second metal lines 18 are respectively in electrical contact with the contact vias 15a, 15b. The materials and formation for the second metal lines 18 are similar to those for the first metal lines 2, and the details thereof are omitted for the sake of brevity. After step 120, the semiconductor device 200 is obtained. In alternative embodiments, other suitable methods may also be applied for forming the semiconductor device 200. In yet alternative embodiments, additional features may be added in the semiconductor device 200, and some features in the semiconductor device 200 may be modified, replaced, or eliminated without departure of the spirit and scope of the present disclosure.

Figure 26:
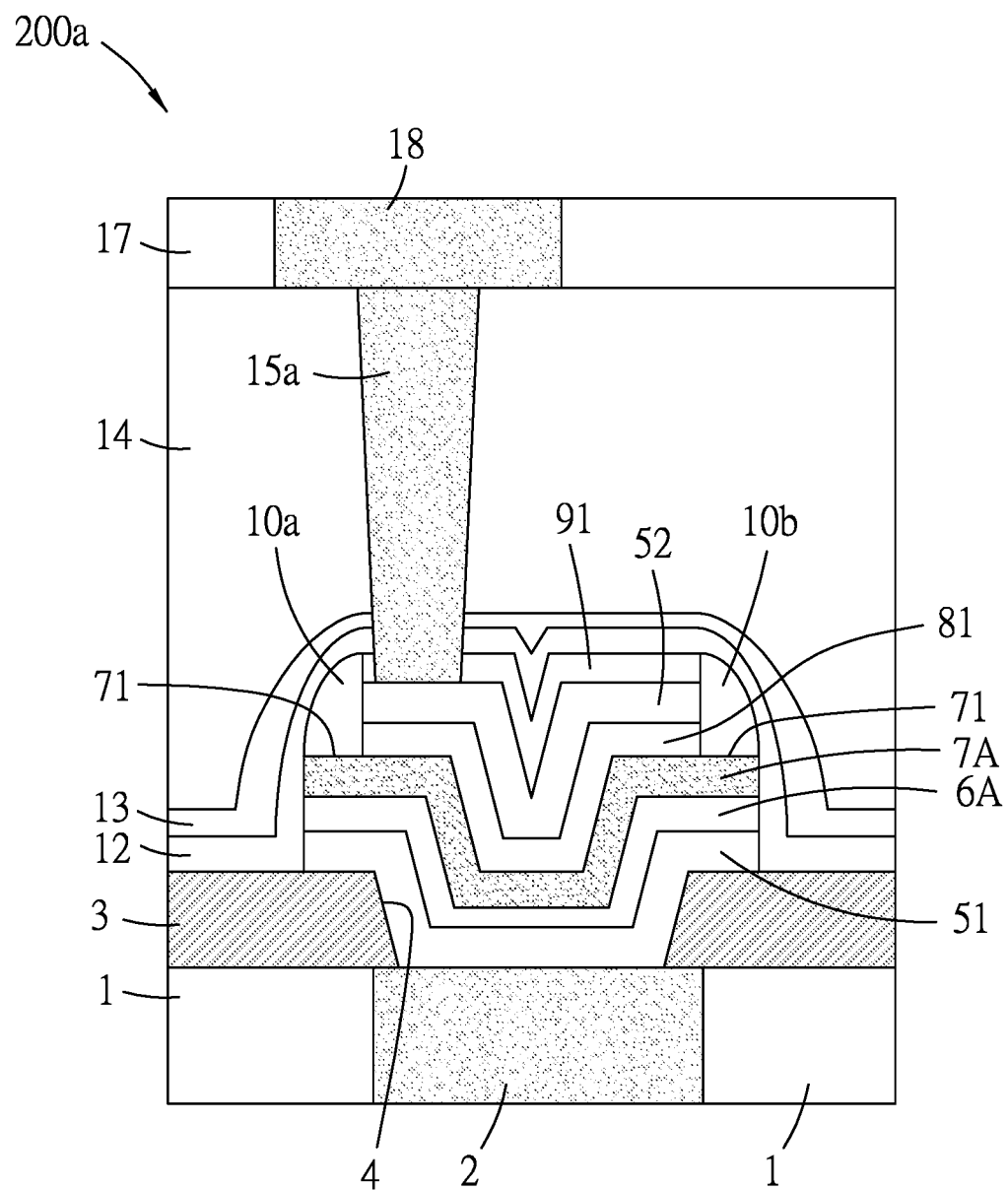
FIG. 26 is a schematic view of a semiconductor device in accordance with some embodiments.
Figure 27:
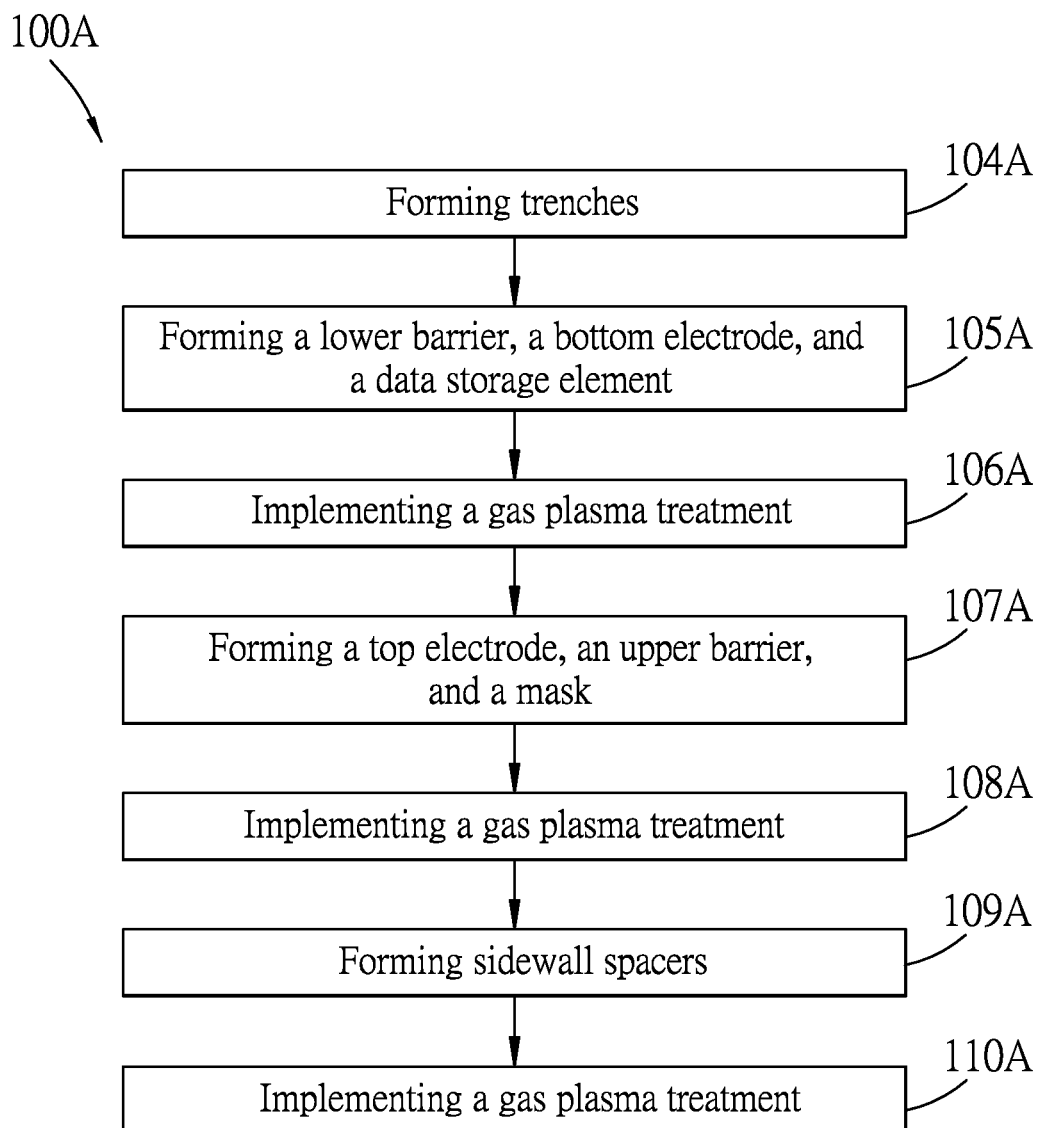
FIG. 27 is a flow diagram illustrating a method for manufacturing a semiconductor device in accordance with some embodiments.

FIG. 26 illustrates a fragmentary schematic view of a semiconductor device 200a in accordance with some embodiments. FIG. 27 is a flow diagram illustrating some steps of a method 100A for manufacturing the semiconductor device 200a in accordance with some embodiments. The semiconductor device 200a is similar to the semiconductor device 200, except that the semiconductor device 200a is made using the method 100A so as to have a different configuration from the semiconductor device 200. The method 100A is similar to the method 100 except that steps 104 to 114 of the method 100 are replaced by steps 104A to 110A of the method 100A. FIGS. 28 to 33 illustrate schematic views of the intermediate stages in steps 104A to 110A of the method 100A.

Figure 28:
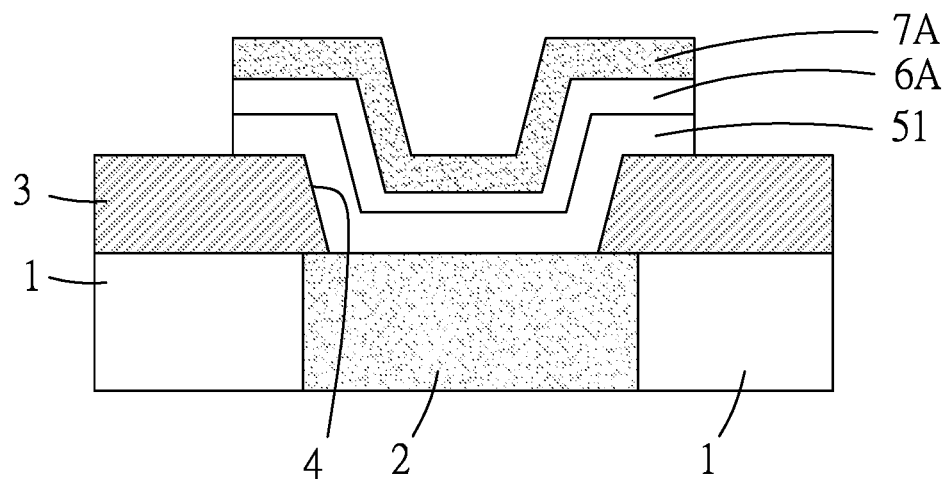
FIGS. 28 to 33 are schematic views illustrating intermediate stages of the manufacturing method in accordance with some embodiments as depicted in FIG. 27.

Referring to FIGS. 27 and 28, the method 100A proceeds to step 104A, where a trench 4 is formed in the first etch stop layer 3 (the first etch stop layer 3 may be obtained in step 103 of the method 100). Step 104A may be implemented in a manner similar to step 104, but the first etch stop layer 3 is treated to have slanted inner surfaces that define the trench 4. Afterwards, the method 100A proceeds to step 105A, where a lower barrier 51, a bottom electrode 6A, and a data storage element 7A are formed, in such order, over the first etch stop layer 3 and in the trench 4. Step 105A may include (i) conformally and sequentially depositing a lower barrier layer (not shown), a bottom electrode layer (not shown), and a ferroelectric layer (not shown) on the first etch stop layer 3 and in the trench 4, and (ii) patterning these layers using known photolithography and etching processes to form the lower barrier layer into the lower barrier 51, to form the bottom electrode layer into the bottom electrode 6A, and to form the ferroelectric layer into the data storage element 7A. The deposition and the materials for the lower barrier layer, the bottom electrode layer and the ferroelectric layer in step 105A are respectively similar to those for the barrier layer 5 described in step 105, the bottom electrode layer 6 described in step 106, and the ferroelectric layer 7 described in step 107, and the details thereof are omitted for the sake of brevity.

Figure 29:
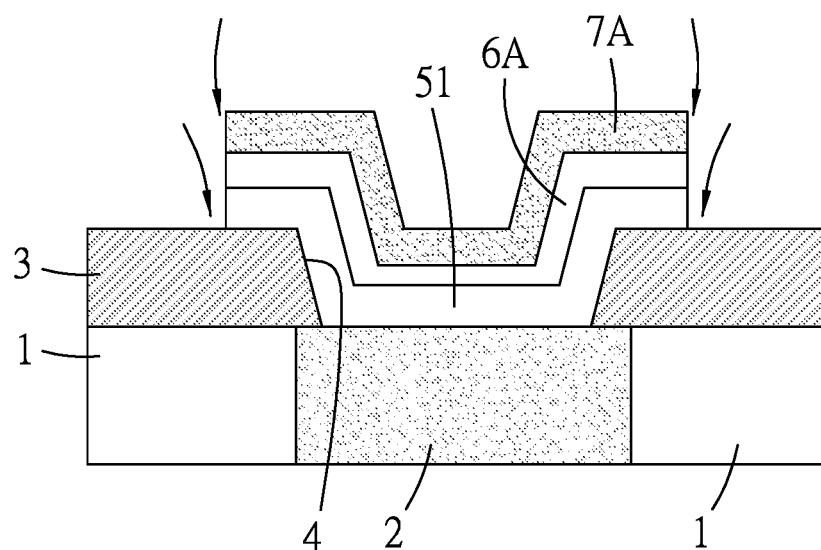

Referring to FIGS. 27 and 29, the method 100A proceeds to step 106A, where a gas plasma treatment is implemented to treat a ferroelectric material of the data storage element 7A. In this step, the plasma generation source and the parameters for generating the plasma (e.g., the plasma generation power, or the treatment time) may be similar to those described in step 111.

Figure 30:
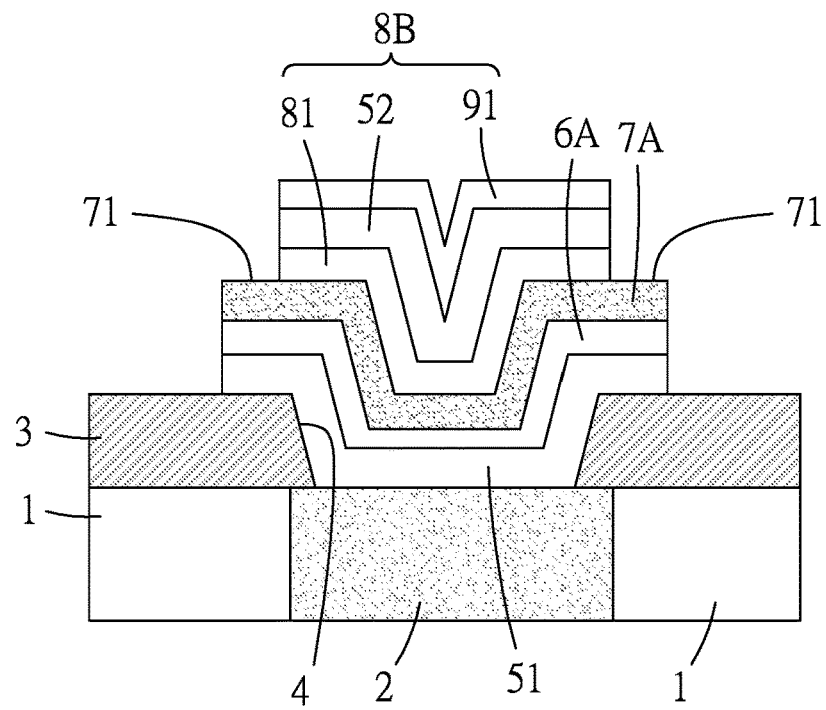

Referring to FIGS. 27 and 30, the method 100A proceeds to step 107A, where a top electrode 81, an upper barrier 52, and a mask 91 are sequentially formed over the structure obtained in step 106A in such order. Step 107A includes (i) conformally and sequentially depositing a top electrode layer (not shown), an upper barrier layer (not shown), and a mask layer (not shown) over the structure of FIG. 29, and (ii) patterning these layers using known photolithography and etching processes, so as to form the top electrode layer into the top electrode 81, to form the upper barrier layer into the upper barrier 52, and to form the mask layer into the mask 91. The deposition and the materials for the top electrode layer, the upper barrier layer, and the mask layer in step 107A are respectively similar to those for the top electrode layer 8 described in step 108, the barrier layer 5 described in step 105, and the mask layer described in step 109, and the details thereof are omitted for the sake of brevity. After step 107A, two peripheral regions 71 of the data storage element 7A are exposed from two opposite sides of a stack 8B. The stack 8B includes the top electrode 81, the upper barrier 52, and the mask 91.

Figure 31:
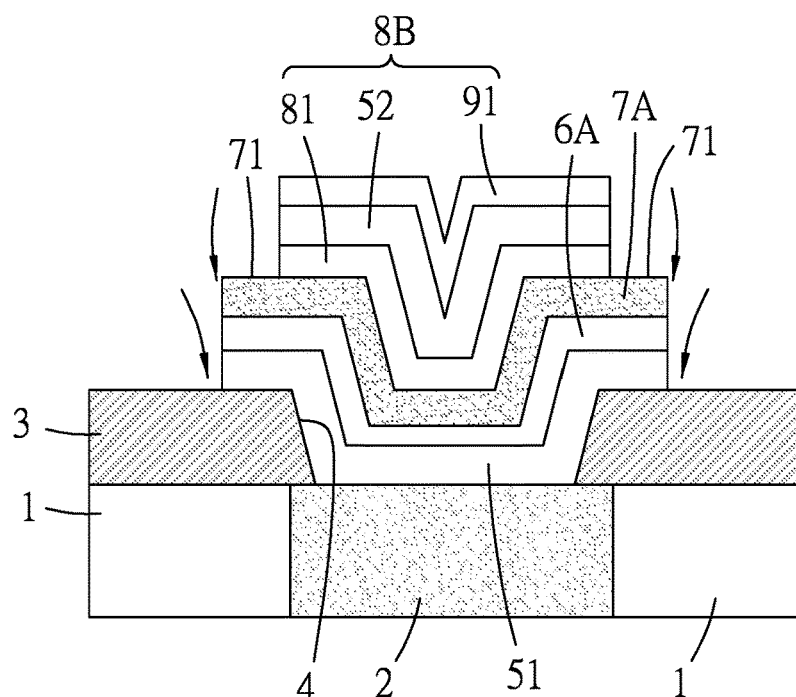

Referring to FIGS. 25 and 31, the method 100A proceeds to step 108A, where a gas plasma treatment is implemented to treat the ferroelectric material of the data storage element 7A. In this step, the plasma generation source and the parameters for generating the plasma (e.g., the plasma generation power, or the treatment time) may be similar to those described in step 111.

Figure 32:
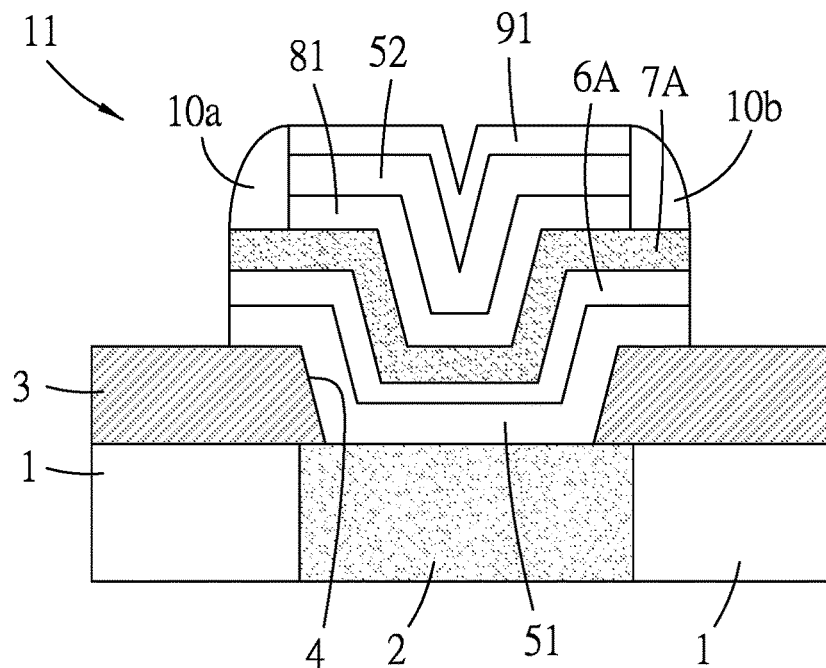

Referring to FIGS. 25 and 32, the method 100A proceeds to step 109A, where sidewall spacers 10a, 10b are respectively formed on the two peripheral regions 71 of the data storage element 7A at two lateral sides of the stack 8B (see FIG. 31). The processes and materials for forming the sidewall spacers 10a, 10b in step 109A are similar to those as described in step 112, and the details thereof are omitted for the sake of brevity. After step 109A, a ferroelectric memory cell 11 is formed.

Figure 33:
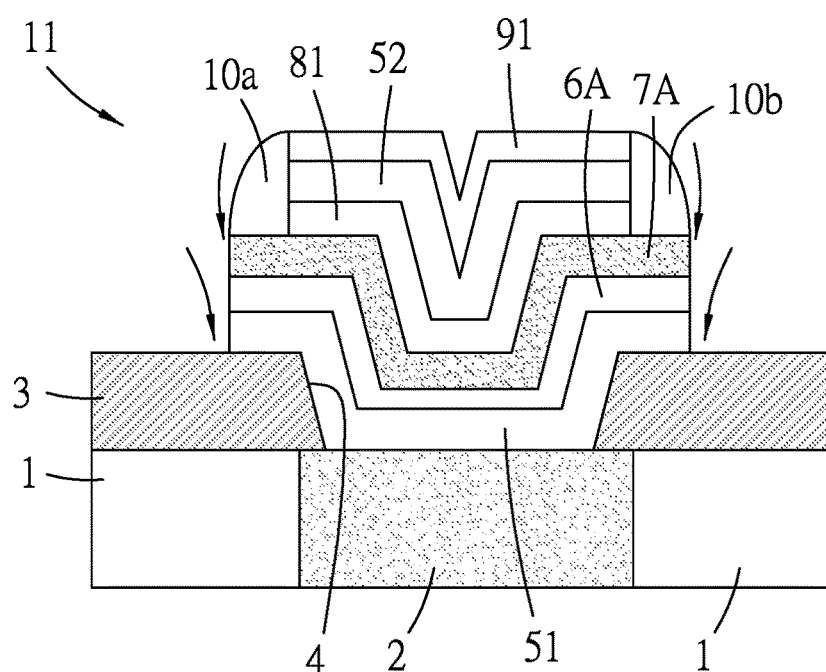

Referring to FIGS. 25 and 33, the method 100A proceeds to step 110A, where a gas plasma treatment is implemented to treat the ferroelectric material of the data storage element 7A. In this step, the plasma generation source and the parameters for generating the plasma (e.g., the plasma generation power, or the treatment time) may be similar to those described in step 111. Afterwards, steps 115 to 120 may be implemented, thereby obtaining the semiconductor device 200a shown in FIG. 26. In some embodiments, all of steps 106A, 108A, and 110A are implemented, while in alternative embodiments, one or two of steps 106A, 108A, and 110A are implemented. After the gas plasma treatment, the peripheral regions 71 of the data storage element 7A may have about at least 60% of ferroelectric phase. In some embodiments, the ferroelectric phase of the peripheral region 71 of the data storage element 7A may be present in a range from about 60% to about 95%.

In alternative embodiments, the gas plasma treatment may be used for transforming a non-ferroelectric phase of a ferroelectric material to a ferroelectric phase. In other words, after a ferroelectric material is etched, a gas plasma may be used to treat the ferroelectric material so as to transform the non-ferroelectric phase of the ferroelectric material, which may be formed during the etching, into a ferroelectric phase. In some embodiments, the ferroelectric material may be etched using dry etching, wet etching (using hydrofluoric acid, phosphoric acid, or other suitable chemicals), or a combination thereof. In some embodiments, the gas plasma may include ammonia, oxygen, ozone, hydrogen, nitrous oxide, $H_2O$, or combinations thereof.

In this disclosure, the gas plasma treatment can be used to treat the ferroelectric material of the data storage element, such that the peripheral region of the data storage element may have about at least 60% of ferroelectric phase (e.g., ranging from about 60% to about 95%). Therefore, the data storage element of the ferroelectric memory cell may have an increased and more uniform ferroelectric phase, and the ferroelectric memory cell (i.e., the FeRAM device) of this disclosure may have a larger remnant polarization ($P_R$) (i.e., a relatively large 2 $P_R$), a lower current leakage, a better data retention, a higher breakdown voltage, and an improved capacitance.

In accordance with some embodiments of the present disclosure, a semiconductor device includes a bottom electrode, a top electrode, a sidewall spacer, and a data storage element. The sidewall spacer is disposed aside the top electrode. The data storage element is located between the bottom electrode and the top electrode, and includes a ferroelectric material. The data storage element has a peripheral region which is disposed beneath the sidewall spacer and which has at least 60% of ferroelectric phase.

In accordance with some embodiments of the present disclosure, the ferroelectric phase of the peripheral region is present in a range from 60% to 95%.

In accordance with some embodiments of the present disclosure, the data storage element includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

In accordance with some embodiments of the present disclosure, the semiconductor device further includes a dielectric layer and a lower barrier disposed between the dielectric layer and the bottom electrode.

In accordance with some embodiments of the present disclosure, the semiconductor device further includes an etch stop layer disposed between the dielectric layer and the bottom electrode. The etch stop layer is formed with a trench. The bottom electrode includes a first portion and a second portion. The first portion is disposed in the trench. The second portion is disposed on the etch stop layer to cover the first portion. The lower barrier is disposed in the trench and between the etch stop layer and the first portion.

In accordance with some embodiments of the present disclosure, the semiconductor device further includes an upper barrier disposed on the top electrode opposite to the data storage element.

In accordance with some embodiments of the present disclosure, each of the upper barrier and the lower barrier independently includes platinum, gold, titanium, tantalum, tungsten, tantalum nitride, titanium nitride, aluminum copper, tungsten nitride, or combinations thereof.

In accordance with some embodiments of the present disclosure, a method for manufacturing a semiconductor device includes: forming a ferroelectric layer which includes a ferroelectric material; forming a top electrode layer on the ferroelectric layer; patterning the top electrode layer to form a top electrode; patterning the ferroelectric layer to form a data storage element; forming a sidewall spacer aside the top electrode such that the data storage element has a peripheral region beneath the sidewall spacer; and treating the ferroelectric material such that the peripheral region of the data storage element has at least 60% of ferroelectric phase.

In accordance with some embodiments of the present disclosure, the ferroelectric phase of the peripheral region is present in a range from 60% to 95%.

In accordance with some embodiments of the present disclosure, the ferroelectric material is treated using a gas plasma.

In accordance with some embodiments of the present disclosure, the gas plasma includes ammonia, oxygen, ozone, hydrogen, nitrous oxide, $H_2O$ or combinations thereof.

In accordance with some embodiments of the present disclosure, the data storage element includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

In accordance with some embodiments of the present disclosure, the ferroelectric material is treated after patterning the top electrode layer and before patterning the ferroelectric layer.

In accordance with some embodiments of the present disclosure, the ferroelectric material is treated after forming the sidewall spacer and patterning the ferroelectric layer.

In accordance with some embodiments of the present disclosure, before forming the ferroelectric layer, the method further includes: forming a bottom electrode layer to permit the ferroelectric layer to be formed thereon; and patterning the bottom electrode layer to form a bottom electrode beneath the data storage element.

In accordance with some embodiments of the present disclosure, the ferroelectric material is treated after patterning the ferroelectric layer and before forming the top electrode layer.

In accordance with some embodiments of the present disclosure, the top electrode layer is patterned after patterning the ferroelectric layer, and the ferroelectric material is treated after patterning the top electrode layer and before forming the sidewall spacer.

In accordance with some embodiments of the present disclosure, a method for transforming a non-ferroelectric phase of a ferroelectric material to a ferroelectric phase includes: etching a ferroelectric material; and treating the ferroelectric material using a gas plasma such that a non-ferroelectric phase in the ferroelectric material, which is generated during the etching, is transformed to a ferroelectric phase.

In accordance with some embodiments of the present disclosure, the ferroelectric material is treated using the gas plasma for a time period ranging from 20 seconds to 200 seconds.

In accordance with some embodiments of the present disclosure, the gas plasma includes ammonia, oxygen, ozone, hydrogen, nitrous oxide, $H_2O$, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a ferroelectric memory cell, comprising:
    forming a bottom electrode;
    forming a ferroelectric layer on the bottom electrode;
    forming a top electrode layer on the ferroelectric layer opposite to the bottom electrode;
    patterning the top electrode layer to form a top electrode such that the ferroelectric layer has a first portion covered by the top electrode and a second portion exposed from the top electrode;
    performing a first plasma treatment to the second portion of the ferroelectric layer; and
    after the first plasma treatment, patterning the second portion of the ferroelectric layer to form a data storage element which includes the first portion and the patterned second portion of the ferroelectric layer, the patterned second portion of the ferroelectric layer having at least 60% of ferroelectric phase, the bottom electrode, the data storage element and the top electrode together forming the ferroelectric memory cell.

2. The method of claim 1, wherein the ferroelectric phase of the patterned second portion of the ferroelectric layer is present in a range from 60% to 95%.

3. The method of claim 1, wherein the gas plasma includes ammonia, oxygen, ozone, hydrogen, nitrous oxide, $H_2O$ or combinations thereof.

4. The method of claim 1, wherein the data storage element includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

5. The method of claim 1, further comprising:
    after patterning the second portion of the ferroelectric layer, performing a second gas plasma treatment to the patterned second portion of the ferroelectric layer.

6. The method of claim 5, wherein, in the each of the first gas plasma treatment and the second gas plasma treatment, a plasma generation power ranges from 200 W to 1000 W.

7. The method of claim 1, wherein, in the each of the first gas plasma treatment and the second gas plasma treatment, a plasma treatment time ranges from 20 seconds to 200 seconds.

8. The method of claim 1, wherein, in each of the first gas plasma treatment and the second gas plasma treatment, a plasma treatment time ranges from 20 seconds to 60 seconds.

9. A method for manufacturing a ferroelectric memory cell, comprising:
- forming a bottom electrode;
- forming a ferroelectric layer on the bottom electrode;
- forming a top electrode layer on the ferroelectric layer opposite to the bottom electrode;
- patterning the top electrode layer to form a top electrode such that the ferroelectric layer has a first portion covered by the top electrode and two second portions exposed from the top electrode, the second portions being located at two opposite sides of the first portion;
- patterning the two second portions of the ferroelectric layer to form a data storage element which includes the first portion and the two patterned second portions of the ferroelectric layer; and
- after patterning the two second portions of the ferroelectric layer, performing a gas plasma treatment to the two patterned second portions of the ferroelectric layer such that each of the two patterned second portions of the ferroelectric layer has at least 60% of ferroelectric phase, to form the ferroelectric memory cell.

10. The method of claim 9, prior to patterning the two second portions of the ferroelectric layer, and after patterning the top electrode layer, further comprising:
- performing an additional gas plasma treatment to the two second portions of the ferroelectric layer.

11. The method of claim 9, wherein:
- after performing the gas plasma treatment, the ferroelectric phase of each of the two patterned second portions of the ferroelectric layer is present in a range from 60% to 95%.

12. The method of claim 9, wherein the top electrode layer includes titanium nitride, platinum, aluminum copper, gold, titanium, tantalum, tantalum nitride, tungsten, tungsten nitride, alloys thereof, or combinations thereof.

13. The method of claim 9, wherein the bottom electrode includes titanium nitride, platinum, aluminum copper, gold, titanium, tantalum, tantalum nitride, tungsten, tungsten nitride, alloys thereof, or combinations thereof.

14. A method for manufacturing a ferroelectric memory cell, comprising:
- forming a dielectric unit which has a first portion with a concave surface, and a second portion with a planar surface;
- forming a bottom electrode and a data storage element on the first portion of a dielectric unit such that the bottom electrode is disposed between the data storage element and the dielectric unit, the data storage element including a ferroelectric material;
- forming a top electrode layer on the bottom electrode and the data storage element to cover the first portion and the second portion of the dielectric unit;
- patterning the top electrode layer such that the top electrode layer is formed into a top electrode on the data storage element and such that the data storage element has a main region covered by the top electrode and a peripheral region exposed from the top electrode;
- performing a gas plasma treatment to the data storage element such that the peripheral region of the data storage element has at least 60% of ferroelectric phase, to form the ferroelectric memory cell.

15. The method of claim 14, wherein after performing the gas plasma treatment, the ferroelectric phase of the peripheral region of the data storage element is present in a range from 60% to 95%.

16. The method of claim 14, wherein the gas plasma treatment is performed prior to forming the top electrode layer.

17. The method of claim 14, wherein the gas plasma treatment is performed after patterning the top electrode layer.

18. The method of claim 14, wherein, in the gas plasma treatment, a plasma generation power ranges from 200 W to 1000 W.

19. The method of claim 14, wherein, in the gas plasma treatment, a plasma treatment time ranges from 20 seconds to 200 seconds.

20. The method of claim 14, wherein a portion of the data storage element has a U-shaped cross-section.

* * * * *